United States Patent [19]

Khoe et al.

[11] 4,389,567
[45] Jun. 21, 1983

[54] SEMICONDUCTOR SWITCHING DEVICE FOR GUIDING AND AMPLIFYING RADIATION

[75] Inventors: Giok D. Khoe; Lambertus J. Meuleman, both of Eindhoven, Netherlands; Tullio E. Rozzi, Wirrat, England

[73] Assignee: U.S. Philips Corporation, New York, N.Y.

[21] Appl. No.: 154,633

[22] Filed: May 30, 1980

[30] Foreign Application Priority Data

Jun. 7, 1979 [NL] Netherlands .................. 7904470

[51] Int. Cl.³ ............................................. H01J 31/50
[52] U.S. Cl. ................................. 250/213 R; 250/227; 350/96.14
[58] Field of Search ............ 250/211 R, 211 J, 213 R, 250/213 A, 227; 455/610, 612; 350/96.12, 96.13, 96.14, 96.15, 96.16, 96.17

[56] References Cited

U.S. PATENT DOCUMENTS

3,465,159 9/1969 Stern ............................... 250/213 R
4,002,898 1/1977 Milton ................................. 455/610
4,175,827 11/1979 McMahon ....................... 350/96.14

*Primary Examiner*—David C. Nelms
*Attorney, Agent, or Firm*—Thomas A. Briody; Robert T. Mayer; Steven R. Biren

[57] ABSTRACT

A semiconductor switching device for guiding and amplifying electromagnetic radiation is disclosed. An electrode pattern which defines a number of strip-shaped guiding members is provided on a layer structure analogous to that of a semiconductor laser. According to the invention the radiation guiding members have tapering juxtaposed ends in a transition area. Adjacent radiation guiding members in the transition area are situated within each other's amplification profile. The radiation guiding members are preferably separated from each other by insulation areas which do not extend to the common active layer. The invention may be used, for example, in switching radiation signals between two or more radiation paths in optical communication.

13 Claims, 7 Drawing Figures

SEMICONDUCTOR SWITCHING DEVICE FOR GUIDING AND AMPLIFYING RADIATION

BACKGROUND OF THE INVENTION

The invention relates to a semiconductor switching device for guiding and amplifying electromagnetic radiation, having a semiconductor body with a substantially flat surface comprising a substrate region which is provided with a connection conductor, and a number of strip-shaped radiation guiding members which comprise a layer structure having an active layer in which the radiation propagates and having a p-n junction in which, for amplification of the radiation, each radiation guiding member is provided at the surface with at least an electrode to control a current in the forward direction through the p-n junction, one or more first radiation guiding members branching into at least two further radiation guiding members which over the greater part of their length are situated outside each other's amplification profile.

A prior art semiconductor switching device as described above is disclosed in U.S. Pat. No. 3,465,159.

In this known device the radiation guiding members comprise layer structures the extension of which, inclusive the active layer in which the radiation propagates, is restricted to the width of the radiation guiding members. The radiation guiding in this device in the direction of width is substantially refractive index guiding. This occurs due to a variation of the effective refractive index for the relevant radiation in the active layer in the direction of width of the radiation guiding member. This variation is caused by doping variations of the layer structure in the direction of width of the radiation guiding member, either in the active layer or in the adjoining layers.

One of the disadvantages of the device described is that, due to the substantially complete separation of the amplification profiles of the radiation guiding members, when using two or more first guiding members each branching into a further guiding member, the radiation in a "first" guiding member which branches into a non-activated "further" guiding member is lost for the radiation guiding. In the activated "further" radiation guiding member(s), therefore, at most only a part of the radiation energy transported by the "first" guiding members will land. This may be an important disadvantage in integrated optical semiconductor switching devices in which the signal strength is generally comparatively small.

Furthermore, the transverse dimensions in known semiconductor switching devices, that is to say the width and the thickness of the radiation guiding members, are so large that guiding of several transverse modes of oscillation is possible. This is undesired in many cases. Transverse modes of oscillation are to be understood to mean herein modes of oscillation both in the direction of width and in the direction of thickness of the radiation guiding member.

SUMMARY OF THE INVENTION

One of the objects of the invention is to remove or at least considerably reduce the previously-described disadvantages of the prior art devices.

The invention is inter alia based on the recognition of the fact that this can be achieved by using radiation guiding members in which no or substantially no refractive index guiding but substantially exclusively gain guiding occurs in the direction of width.

A semiconductor switching device as described above is characterized according to the invention in that there is provided on the substrate region a layer structure which is common for all radiation guiding members and has an active layer of a homogeneous thickness and doping concentration, in which in the transition area between a first and a further radiation guiding member the electrode of said guiding members show tapering juxtaposed ends, that in the transition area taken in the direction of width of the radiation guiding members, the active layer has such a small effective refractive index variation for the radiation and the distance between two adjacent radiation guiding members is so small that they are situated within each other's amplification profile, and that the transverse dimensions of all radiation guiding members are so small that guiding and amplification of only one single transversal mode of oscillation occurs.

It is to be noted that the radiation may comprise both visible light and infrared or ultraviolet radiation. Furthermore, in this application the width of a radiation guiding member is defined as the width of the electrode provided thereon while, as already noted above, transverse dimensions are to be understood to be both the dimensions in the direction of width and in the direction of thickness. Furthermore, refractive index is to be understood to be the real part of the refractive index for the relevant radiation.

In contrast with the known device, in the semiconductor switching device according to the invention, substantially no refractive index guiding in the width direction occurs but substantially only gain guiding, so that a more efficient output coupling from the first radiation guiding members to the second radiation guiding members connected thereto is achieved. For example, upon coupling out a radiation signal travelling through two first radiation guiding members from one of said first guiding members into a further guiding member, the electrode of the other first guiding member may be biased in such a way that substantially no absorption occurs thereunder. As a result of this, substantially the whole radiation energy transported through the two first guiding members can be coupled into said further radiation guiding member with a minimum loss of energy.

The mutual distance between two adjacent radiation guiding members in the transition area is preferably at most 4 $\mu$m; the length of the transition area is preferably at least 50 $\mu$m.

For the layer structure a layer structure is preferably used which is common for double heterojunction lasers and which has an active layer which is bounded by two passive layers having a larger forbidden band gap than the active layer, in which the active layer forms a p-n junction with one of the passive layers. In the direction of thickness, the radiation is restricted substantially to the active layer due to the larger forbidden band gap of the passive layers.

Although in certain circumstances the radiation guiding members may be defined exclusively by the electrodes present on the layer structure and the strip-shaped regions of high current density determined thereby, in which the radiation guiding members are sufficiently separated electrically at least outside the transition area by the resistance of the semiconductor layers in a direction parallel to the surface, preferably all radiation guiding members are separated electrically from each other by insulation regions which extend down to a smaller depth than the common active layer.

In order to be sure that only one single transverse mode of oscillation is amplified, the width of the electrodes is preferably at most 5 μm and the thickness of the active layer is preferably at most 0.3 μm.

The insulation regions may be regions which form a p-n junction with the adjoining semiconductor material, or regions consisting of a dielectric insulating material, for example silicon oxide. However, for this purpose, preferably regions of a very high resistivity are used, which regions are obtained by a proton bombardment, as is usual in strip-shaped laser structures.

In principle, for example, in integrated circuits comprising other components in addition to the radiation guiding members, the coupling-in and out of the radiation can in principle be done in an arbitrary manner. According to a preferred embodiment, however, this is done so that the radiation is incident on the semiconductor body via a first side face of the semiconductor body which extends substantially perpendicular to the said flat surface, which first side face intersects at least one of the radiation guiding members and is covered with an anti-reflection layer, and that the radiation emanates via a second side face which also extends substantially perpendicular to said flat surface and which intersects at least one of the radiation guiding members and is covered with an anti-reflection layer.

The semiconductor switching device according to the invention can advantageously be used to couple out a radiation signal which is coupled in via an input glass fiber, arbitrarily via one of a plurality of output glass fibers. In connection herewith a further preferred embodiment is characterized in that the radiation is incident via said first side face on two closely spaced substantially parallel first radiation guiding members, said radiation guiding members branching into two further guiding members which intersect said second side face and which near said second side face are situated at a mutual distance which is considerably larger than the mutual distance of said first guiding members near said first side face.

BRIEF DESCRIPTION OF THE DRAWING

The invention will now be described in greater detail with reference to the drawing, in which.

The Figures are diagrammatic and not drawn to scale. Corresponding parts in the figures are referred to by the same reference numerals.

DETAILED DESCRIPTION OF THE PREFERRED EMBODIMENTS

Figure 1:
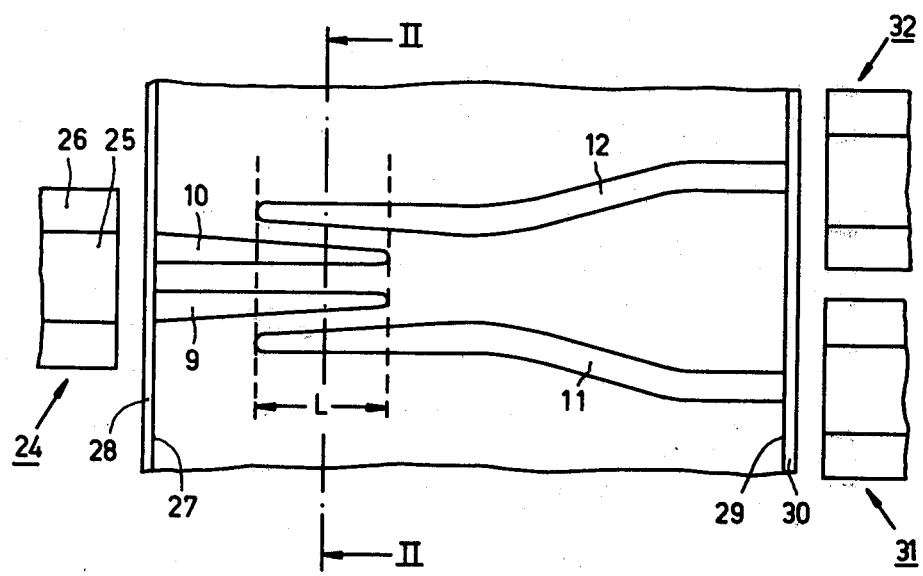
FIG. 1 is a diagrammatic plan view of a first embodiment of a device according to the invention.
Figure 2:
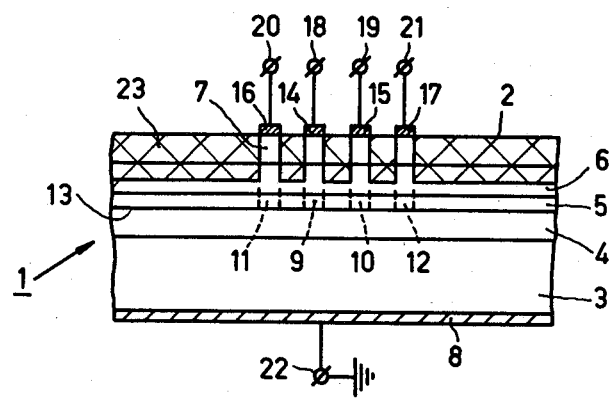
FIG. 2 is a diagrammatic cross-sectional view of the device taken on the line II—II of FIG. 1.

FIG. 1 is a plan view and FIG. 2 a diagrammatic cross-sectional view taken on the line II—II of FIG. 1 of a first embodiment of a semiconductor switching device according to the invention. The device comprises a semiconductor body 1 having a substantially flat surface 2. The semiconductor body comprises a substrate region 3 which is provided with a connection conductor in the form of a metal layer 8 provided on the substrate region 3 which in this example comprises of gallium arsenide. The device furthermore comprises a number of strip-shaped radiation guiding members 9, 10, 11 and 12 the boundaries of which are shown in broken lines in the cross-sectional view of FIG. 2.

The radiation guiding members comprise a layer structure having an active layer 5, in this example of gallium arsenide, in which the radiation propagates, and having a p-n junction 13. In order to amplify the radiation, all the radiation guiding members are provided at the surface 2 with electrodes (14, 15, 16, 17) in the form of a metal layer. By applying a positive voltage to one or more of the electrodes 14 to 17 via the connection terminals 18, 19, 20, 21 and 22, with respect to metal layer 8 (which may, for example, be connected to ground), a current can be passed in the forward direction over the p-n junction 13 so that in the relevant radiation guiding member amplification may occur via the same amplification mechanism which is operative in p-n lasers and need not be further described here. However, since the radiation guiding members are not situated within a resonator, laser action cannot occur in the device according to the invention.

The device shown in FIGS. 1 and 2 comprises two first radiation guiding members 9 and 10 which branch into two further radiation guiding members 11 and 12 which are situated for the greater part of their length outside each other's amplification profile.

According to the invention, a layer structure comprising of the semiconductor layers 4, 5, 6 and 7 having an active layer 5 of homogeneous thickness and doping concentration common for all the radiation guiding members is provided on the substrate region 3. All radiation guiding members are separated electrically from each other by the insulation regions 23 which are cross-hatched in FIG. 2 and which extend down to a smaller depth than the common active layer 5. Furthermore, according to the invention and as shown in FIG. 1, the electrodes 14, 15, 16 and 17 of the radiation guiding members within the transition area (denoted by L in FIG. 1) between the first guiding members 9 and 10 and the further guiding members 11 and 12 have more or less tapering ends which are juxtaposed within the transition area L. According to the invention, the active layer 5, taken in the direction of width of the radiation guiding members 9, 10, 11 and 12, furthermore shows such a small effective refractive index variation for the transported radiation, and the distance between two adjacent radiation guiding members (11-9; 9-10; 10-12) is so small, that a radiation guiding member and a juxtaposed adjacent radiation guiding member are situated within each other's amplification profile. Finally, according to the invention, the transverse dimensions (width and thickness) of all radiation guiding members are so small that guiding and amplification of only one single transversal mode of oscillation occurs.

The amplification profile of a radiation guiding member is to be understood to mean herein the area, in the direction of width of the radiation guiding member, over which the amplification factor for the relevant radiation is positive.

In the device described, a layer structure is used which is usual in the manufacture of semiconductor lasers.

The electric connection to the electrode layers 14 to 17 is shown diagrammatically only in FIG. 2; due to the small width of said electrode layers these are connected in practice to larger metal contact pads (bond flaps) which are insulated from the semiconductor surface by an insulating layer and are not shown in the figures. Connection wires may then be provided on said contact pads in a manner conventionally used in semiconductor technology.

In this example a substrate 3 of monocrystalline n-type gallium arsenide (GaAs) with a (001) orientation of its upper surface, a doping concentration of approximately $10^{18}$ donor atoms per $cm^3$ and a thickness of approximately 80 $\mu m$ is used. A first passive epitaxial n-type layer 4 of gallium aluminium arsenide ($Al_x$-$Ga_{1-x}As$) with x=0.3, a doping concentration of approximately $3 \times 10^{17}$ tin atoms per $cm^3$ and a thickness of approximately 2 $\mu m$ is provided thereon. The active layer 5, in this example a 0.3 $\mu m$ thick layer of p-type GaAs having a doping concentration of approximately $3 \times 10^{17}$ germanium atoms per $cm^3$ is deposited on the layer 4. A second passive layer 6 having a composition $Al_{0.3}Ga_{0.7}As$, with a larger forbidden band gap than layer 5, p-type conductive with a doping concentration of approximately $5 \times 10^{17}$ germanium atoms per $cm^3$, and a thickness of approximately 1.5 $\mu m$ is provided on the layer 5. Finally a p-type contact layer 7 of GaAs having a thickness of also approximately 1.5 $\mu m$ and a doping concentration of approximately $10^{18}$ germanium atoms per $cm^3$ is providfed on layer 6. At their interface the layers 4 and 5 form the p-n junction 13. The high-ohmic cross-hatched insulation regions 23 with a very high resistivity are formed by means of a proton bombardment. The metal layers 14 and 15 may be, for example, of gold, while the metal layer 8 may be of a gold-germanium-nickel alloy. The metal layers 14 and 15 which determine the width of the radiation guiding members have a width of, for example, 5 $\mu m$.

As shown diagrammatically in the plan view of FIG. 1, in this example radiation, preferably originating from a laser is incident, from a glass fiber having a core 25 and a sheath 26, on the semiconductor body at a first side face 27 of the semiconductor body which extends substantially perpendicular to the flat surface 2 and which intersects the radiation guiding members 9 and 10 and is covered with a dielectric anti-reflection layer 28. The radiation emanates from a second side face 29 which also extends substantially perpendicular to the surface 2, which in this example extends parallel to the first side face and intersects the radiation guiding members 11 and 12, which second side face is also covered with an anti-reflection layer 30. The emanating radiation can be received in and be further guided through the glass fibers 31 and 32. All the glass have a diameter of approximately 100 $\mu m$. The radiation guiding members 9 and 10 are separated by a distance of approximately 4 $\mu m$ so that the radiation incident via the glass fiber 24 can be further guided by two radiation guiding members 9 and 10; the distance between the further radiation guiding members 11 and 12 at the side face 29 is approximately 104 $\mu m$, considerably larger than that of the first radiation guiding members 9 and 10 near the side face 27, so that the radiation emanating from the radiation guiding members 11 and 12 can easily be received in the juxtaposed glass fibers 31 and 32. The length L of the transition area between the first radiation guiding members 9 and 10 and the second radiation guiding members 11 and 12 (see FIG. 1) is approximately 80 $\mu m$; the length of the straight parts of the radiation guiding members near the end faces 27 and 29 outside the transition area L is approximately 50 $\mu m$. The distance between the radiation guiding members 10 and 12 and between the radiation guiding members 9 and 11 in the transition area L is approximately 4 $\mu m$. The overall length between the side faces 27 and 29 is 500 $\mu m$; and the curves in the radiation guiding members 11 and 12 have a radius of curvature of approximately 1000 $\mu m$ and an arc length of approximately 10°. For good radiation guiding without too much loss the radius of curvature is preferably chosen to be not smaller than 200 $\mu m$. In the case of larger radii of curvature than approximately 1500 $\mu m$, the required length of the device necessary to realize a sufficiently large distance between the guiding members 11 and 12 near the side face 29 becomes too large for many practical applications. The radius of curvature at the "tips" of the tapered electrodes 14, 15, 16 and 17 is approximately 2 $\mu m$.

In the operating condition a current is supplied in the forward direction to the p-n junction 13 both via the electrode 14 and via the electrode 15. When current is also applied to the electrode 17 of radiation guiding member 12, radiation which is incident on the radiation guiding members 9 and 10 via the glass fiber 24 is substantially entirely transmitted to radiation guiding member 12 and thence to glass fiber 32. Since radiation guiding member 9 is also energized, the electric field can cross gradually from guiding member 9 to 10 and from 10 to 12 since adjacent radiation guiding members are situated within each other's amplification profile, without the radiation near the transition area landing in an absorbing area. Conversely, when instead of the radiation guiding member 12 the guiding member 11 is energized, the radiation transported by the radiation guiding members 9 and 10 will gradually flow into guiding member 11.

Although, for simplification of the circuit, the same voltage will preferably be applied to the electrodes 14 and 15, this need not be the case. When radiation passes from the radiation guiding members 9 and 10 to guiding member 12, amplification need occur only in the guiding members 10 and 12; for guiding member 9 it is sufficient that no radiation absorption occurs so that a smaller current density will suffice in radiation guiding member 9. The reverse case occurs when radiation passes from the guiding members 9 and 10 to guiding member 11. It is to be noted that the direction of the radiation can also be reversed. For example, radiation can be guided to the guiding members 9 and 10 either from glass fiber 31, or from glass fiber 32 via the radiation guiding members 11 or 12, respectively, and then to glass fiber 24.

The semiconductor switching device as described above can be manufactured by means of the technology developed for the manufacture of semiconductor lasers. For example, the layer structure (3, 4, 5, 6, 7) can be realized advantageously by epitaxial deposition of the layers 4, 5 6 and 7 from the liquid phase and also from the vapour phase. The details of this prior art process are of no relevance to the invention; reference is made, for example, to the book by D. Elwell and H. J. Scheel, Crystal Growth from High Temperature Solutions, Academic Press 1975, pp 433–467.

The insulation area 23 can most simply be realized by means of a proton bombardment. For that purpose, for example, a layer of gold is provided on the surface 2 by vapor deposition and etching while using conventional photolithographic masking and etching methods at the area of the radiation guiding members 9, 10, 11 and 12, which layer is then used as a masking against a proton bombardment. Usual conditions for this proton bombardment are, for example, an energy of about 200 keV and a dose of about $10^{15}$ protons per $cm^2$; the thickness of the regions 23 becomes approximately 2 $\mu m$. Alloy contacts may then be provided on the layers of gold, either directly or via one or more intermediate metal layers. The metal layer 8 may be provided on the opposite surface of the semiconductor plate by vapor deposition or differently.

The device may be provided, for example, with the metal layer 8 on a cooling plate of copper. The cooling is more efficient when the semiconductor wafer is provided on a cooling member with its opposite surface 2, which however, must then be electrically insulated so as not to short-circuit the electrodes 16, 17, 18 and 19. For this purpose, for example, beryllium oxide could be used in which parts of the electrodes 16, 17, 18 and 19 must project beyond the crystal for contacting.

Figure 3:
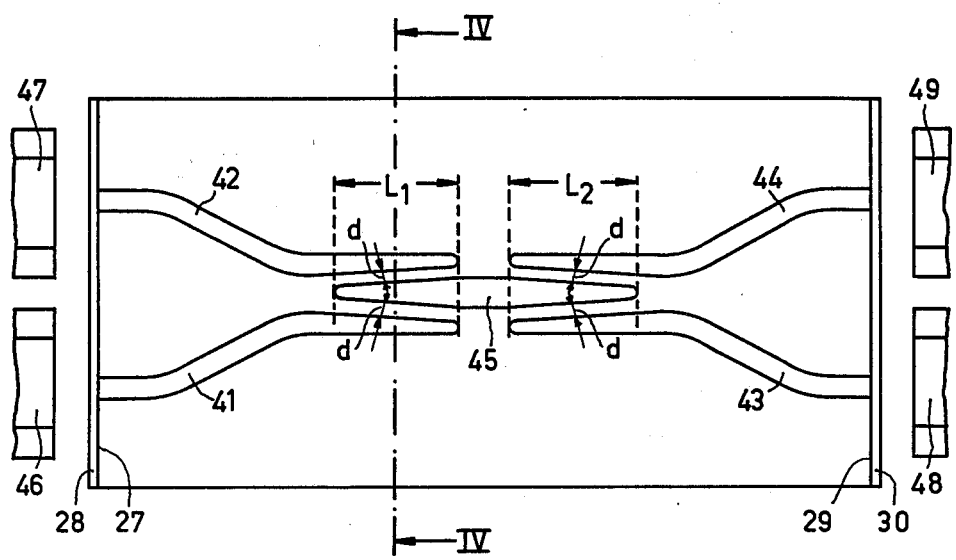
FIG. 3 is a diagrammatic plan view of another embodiment of the device in accordance with the invention.
Figure 4:
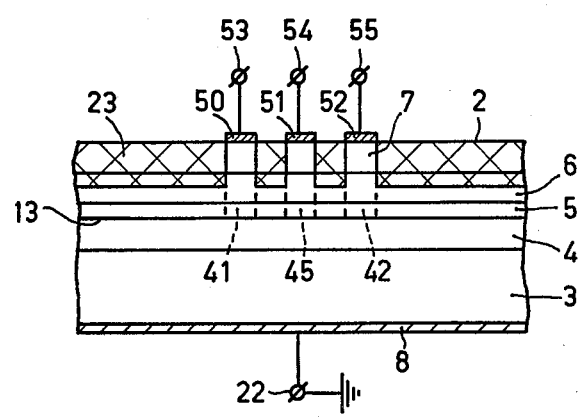
FIG. 4 is a diagrammatic cross-sectional view of the device taken on the line IV—IV of FIG. 3.

FIG. 3 is a plan view and FIG. 4 a diagrammatic cross-sectional view taken on the line IV—IV of FIG. 1, of another embodiment of the semiconductor switching device in accordance with the invention. In this embodiment an electrode configuration is used in which switching between 4 radiation guiding members 41, 42, 43 and 44 can be realized. The layer structure may be the same as that of the previous embodiment; the insulation regions 23 may also be obtained in the same manner. FIG. 2 is a cross-sectional view through the radiation guiding members 41, 45 and 42 with their electrodes 50, 51 and 52 and their connection terminals 53, 54 and 55.

In this embodiment a first radiation guiding member 45 branches at its one end via a transition area $L_1$ into two further radiation guiding members 41 and 42 and at its other end via a second transition area $L_2$ into two further radiation guiding members 43 and 44. The (in this example equal) mutual distances d (see FIG. 3) of adjacent radiation guiding members in the transition areas $L_1$ and $L_2$ is 4 $\mu m$ and is again such that juxtaposed radiation guiding members are situated within each other's amplification profile.

When the electrodes of the radiation guiding members 42, 45 and 43 are energized with a voltage which in this example is positive relative to connection terminal 22, radiation can be passed from glass fiber 47 into glass fiber 48, or vice versa. When the guiding members 42, 45 and 44 are activated, radiation from glass fiber 47 is directed to glass fiber 49 or vice versa. In the same manner, radiation from glass fiber 46 may be coupled arbitrarily to glass fiber 48 or 49, or vice versa. The radiation guiding member 45 is always energized and ensures a smooth crossing-over of the electric field. The device may be manufactured in the same manner as that shown in FIGS. 1 and 2.

Figure 5:
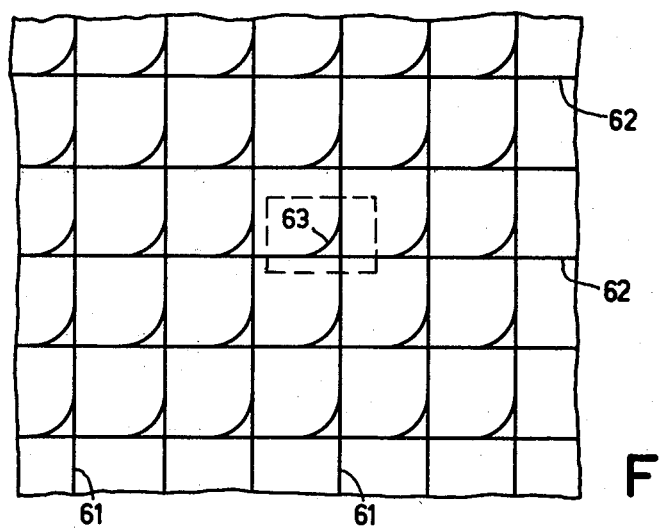
FIG. 5 is a diagrammatic plan view of a third device in accordance with the invention.
Figure 6:
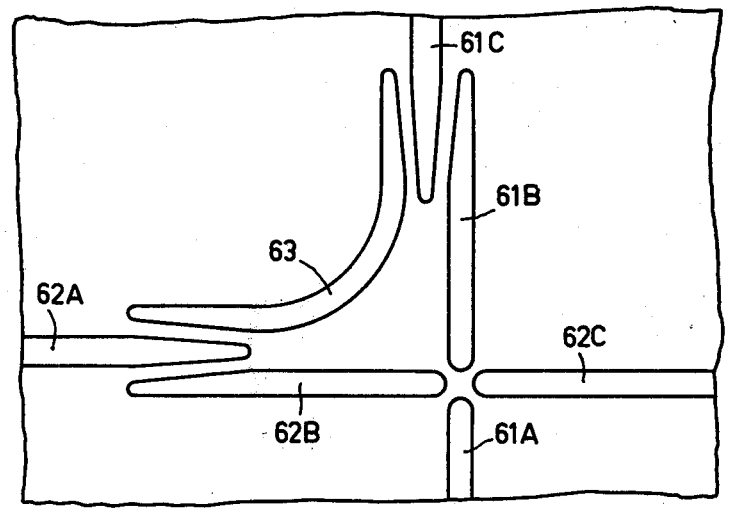
FIG. 6 is a detail of the plan view shown in FIG. 5.

FIGS. 5 and 6 show an embodiment of the invention in which the device comprises a matrix of crossing first and second radiation guiding members 61 and 62 as shown in the diagrammatic plan view of FIG. 5. A first, straight radiation guiding member 61 branches, at the area of a crossing, into at least a curved further radiation guiding member 63 which at its other end branches into at least a straight second radiation guiding member 62 extending perpendicular to the first radiation guiding member 61. FIG. 6 is a detailed plan view of a crossing area as surrounded in broken lines in FIG. 5. From this view it may be seen that both the radiation guiding member 61 and the radiation guiding member 62 comprise of several straight segments (61A, B, C; 62A, B, C) in which the segments belonging to one straight radiation guiding member are not all situated in line with each other. The mutual distances of the segments of the same straight radiation guiding member, in the order of 4 $\mu m$ or less, and their location relative to each other, however, are such that they permit radiation transport in the same direction when their electrodes are energized. A cross-sectional view through the semiconductor body has not been drawn since this is entirely analogous to that of FIGS. 2 and 4; only the electrode configuration is different from that shown in the preceding examples.

When (see FIG. 6) current is applied to the segments 62A, 61C and to the radiation guiding member 63, the radiation path, when the radius of curvature of the guide 63 is not too small (preferably not smaller than 200 $\mu m$) will extend from 62A via 63 to 61C, or vice versa. When the radiation guiding member 63 is not energized, radiation guiding is only possible via the channels 61 or 62, at least when the correct segments are energized.

Such a matrix may be useful in integrated circuits for optical communication, for example for adding or distributing radiation signals. The electrodes should have such a width that only one single mode of oscillation is passed; for that purpose this width is preferably 5 $\mu m$ or less. As a result of the current spreading below the electrodes the optical guiding will experience little hindrance from the interruptions between the segments.

The invention is not restricted to the embodiments described. The optical signals may be coupled in and out via side faces of the crystals, as shown, for example in FIGS. 1 and 3, but also, for example, by providing V-shaped grooves in the crystal surface and laying a glass fiber therein which causes the radiation signal to be incident either directly on the active layer 5, or on the adjoining passive layer 6 which then serves as an optical guide.

Figure 7:
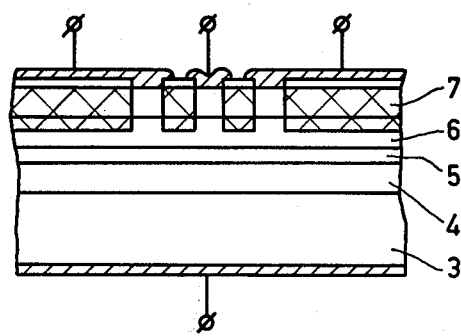
FIG. 7 is a modified embodiment of the device shown in FIG. 2.

Instead of the high-ohmic regions 23 in the examples obtained by proton bombardments, n-type regions formed by diffusion or ion implantation of donor atoms in the p-type layers 6 and 7 may also be used although as already noted above, in certain circumstances the regions 23 may even be omitted entirely. The electrode layers, as shown in FIG. 7 for the FIG. 4 embodiment, may also be provided, instead of in the simple manner shown in the embodiments described, by first providing on the surface 2 an insulating layer and etching therein apertures at the area of the radiation guiding members. The metal layer which forms the electrode may then be wider than the etched aperture and extend adjacent to it on the insulating layer. In this context, the width of the electrodes is to be understood to mean the width of the said apertures in the insulating layer.

Finally, the electrode configuration may be varied in many other manners other than in the embodiment described. For example, in the FIGS. 1 and 2 embodiment a third further guiding member, the end of which is present within the transition area between the guiding members 9 and 10, may be present in addition to the further guiding members 11 and 12. The semiconductor materials used and the conductivity types may also be varied at will by those skilled in the art without departing from the scope of this invention. Furthermore, it is not strictly necessary for the radiation used to be coherent, although the use of incoherent radiation presents disadvantages.

What is claimed is:

1. A semiconductor switching device for guiding and amplifying electromagnetic radiation, having a semiconductor body with a substantially flat surface comprising a substrate region which is provided with a connection conductor, a plurality of strip-shaped radiation guiding members which comprise a layer structure having an active layer in which the radiation propagates and having a p-n junction in which each radiation guiding member is provided at its surface with at least one electrode for controlling a current in the forward direction through the p-n junction, at least one first radiation guiding member branching through a transition area into at least two further radiation guiding members which over the greater part of theri length are situated outside each other's amplification profile, and a layer structure on the substrate region which is common to all radiation guiding members and has an active layer of a homogeneous thickness and doping concentration, in which in the transition area between said first and said further radiation guiding members the electrodes of said guiding members have tapering juxtaposed ends, the active layer in the transition area, taken in the direction of width of the radiation guiding members, having a sufficiently small effective refractive index variation for the radiation and the distance between the two adjacent radiation guiding members being sufficiently small such that the guiding members are situated within each other's amplification profile, and the transverse dimensions of all radiation guiding members being sufficiently small such that guiding and amplification of only one single transversal mode of oscillation occurs.

2. A semiconductor switching device as claimed in claim 1, characterized in that all radiation guiding members are mutually separated electrically by insulation regions extending down to a smaller depth than that of the common active layer.

3. A semiconductor switching device as claimed in claim 1 or 2, characterized in that in the transition area the distance between two adjacent radiation guiding members is at most 4 μm.

4. A semiconductor switching device as claimed in claim 3, characterized in that the length of the transition area is at least 50 μm.

5. A semiconductor switching device as claimed in claim 1 or 2, characterized in that said active layer is bounded by two passive layers having a larger forbidden band gap than that of said active layer, the active layer forming a p-n junction with one of said passive layers.

6. A semiconductor switching device as claimed in claim 1 or 2, characterized in that the width of the electrodes is at most 5 μm.

7. A semiconductor switching device as claimed in claim 1 or 2, characterized in that the thickness of said active layer is at most 0.3 μm.

8. A semiconductor switching device as claimed in claim 2, characterized in that said insulation regions are formed by regions of a very high resistivity which have been obtained by proton bombardment.

9. A semiconductor switching device as claimed in claim 1 or 2, characterized in that the radiation on the semiconductor body is incident via a first side face of the semiconductor body which extends substantially at right angles to said flat surface, said first side face intersecting at least one of said first radiation guiding members and being covered with an antireflection layer, and in that the radiation emanates via a second side face which also extends substantially at right angles to said flat surface and which intersects at least one of said further radiation guiding members and is covered with an anti-reflection layer.

10. A semiconductor switching device as claimed in claim 9, characterized in that the radiation is incident via said first side face on two closely spaced substantially parallel first radiation guiding members, said radiation guiding members branching into two further radiation guiding members which intersect said second side face and which near said second side face are situated at a mutual distance which is considerably larger than the mutual distance of said first guiding members near said first side face.

11. A semiconductor switching device as claimed in claim 1 or 2, characterized in that said first radiation guiding member branches at each of its ends into said at least two further radiation guiding members.

12. A semiconductor switching device as claimed in claim 1 or 2, characterized in that the device comprises a matrix of crossing mutually-perpendicular first and second radiation guiding members, in which at the area of a crossing a first straight radiation guiding member branches into at least a further bent radiation guiding member which at its other end branches into at least a second straight radiation guiding member extending at right angles to the first.

13. A semiconductor switching device as claimed in claim 1 or 2, characterized in that the amplified and guided radiation is coherent.

* * * * *